United States Patent
Shih et al.

(10) Patent No.: US 10,643,968 B2
(45) Date of Patent: May 5, 2020

(54) VERTICALLY DIE-STACKED BONDER AND METHOD USING THE SAME

(71) Applicant: GALLANT MICRO. MACHINING CO., LTD., New Taipei (TW)

(72) Inventors: Tun-Chih Shih, New Taipei (TW); Liang-Yin Huang, New Taipei (TW)

(73) Assignee: GALLANT MICRO. MACHNING CO., LTD., New Taipei (TW)

( * ) Notice: Subject to any disclaimer, the term of this patent is extended or adjusted under 35 U.S.C. 154(b) by 0 days.

(21) Appl. No.: 16/549,260

(22) Filed: Aug. 23, 2019

(65) Prior Publication Data
US 2019/0378811 A1 Dec. 12, 2019

Related U.S. Application Data

(62) Division of application No. 15/964,165, filed on Apr. 27, 2018, now Pat. No. 10,438,917.

(30) Foreign Application Priority Data

May 2, 2017 (TW) .............................. 106114523 A

(51) Int. Cl.
*H01L 23/00* (2006.01)

(52) U.S. Cl.
CPC ............ *H01L 24/741* (2013.01); *H01L 24/75* (2013.01); *H01L 24/80* (2013.01); *H01L 24/94* (2013.01); *H01L 2224/75745* (2013.01); *H01L 2224/75753* (2013.01); *H01L 2224/75822* (2013.01); *H01L 2224/75824* (2013.01)

(58) Field of Classification Search
CPC ....... H01L 24/741; H01L 24/75; H01L 24/80; H01L 24/94
See application file for complete search history.

(56) References Cited

U.S. PATENT DOCUMENTS 6,280,135 B1 8/2001 Cunningham

*Primary Examiner* — Anthony Ho
(74) *Attorney, Agent, or Firm* — Wpat, PC

(57) ABSTRACT

A vertically die-stacked bonder able to stack laterally dies one by one includes a self-elevating unit, a retrieval unit neighbored to the self-elevating unit, and a receiving unit neighbored to the retrieval unit. At least one die is located at the self-elevating unit. The self-elevating unit elevates one die by 90 degrees, so as to form a vertical state. The retrieval unit hands over the die in the vertical state to the receiving unit. The self-elevating unit then elevates another die by 90 degrees once again. The retrieval unit stacks laterally the another die in the vertical state to the previous die at the receiving unit. Thereupon, by stacking laterally the dies in the vertical state orderly, the speed of die stacking can be increased, the production costs can be reduced, and the productivity can be increased.

8 Claims, 4 Drawing Sheets

VERTICALLY DIE-STACKED BONDER AND METHOD USING THE SAME

This application claims the benefit of Taiwan Patent Application Serial No. 106114523, filed May 2, 2017, the subject matter of which is incorporated herein by reference.

BACKGROUND OF THE INVENTION

(1) Field of the Invention

The invention relates to a vertically die-stacked bonder and a method using the same, and more particularly to the vertically die-stacked bonder and the method using the vertically die-stacked bonder that can elevate the die elevate by 90 degrees so as to achieve a vertical state of die, such that a plurality of dies can be orderly and laterally stacked together. Thereupon, the stacking efficiency of the dies can be enhanced, the production speed can be increased, and the production cost can be reduced.

(2) Description of the Prior Art

Recently, one of mainstream technology in the semiconductor industry is to chase multi-functions, high-capacity, compactness and minimization. For example, the stacked package on package (PoP) is a technology that involves die stacking and package stacking. In order to increase the line density of the semiconductor component but decrease the package volume thereof, the PoP usually adopts a 3-dimensional vertical stacking for the entire integration.

Currently, the 3-dimensional vertical stacking is to stack together a plurality of stack-able semiconductor packages, so as to form a PoP module.

However, at least three shortcomings exist in the aforesaid 3-dimensional vertical stacking. One of these shortcomings is the low production speed, another thereof is the high production cost, and the third thereof is the poor binding rate between semiconductors. Thereby, the number of stacking layers would be limited. Obviously, an improvement upon the packaging technique or the 3-dimensional stacking would be definitely welcome to the art.

SUMMARY OF THE INVENTION

Accordingly, it is an object of the present invention to provide a vertically die-stacked bonder and a method using the vertically die-stacked bonder that can produce a vertical state of dies by elevating each of the dies by 90 degrees and then stack the dies orderly and laterally, such that the production speed can be enhanced, the production cost can be reduced, the maximum number of stack-able die layers can be increased, and the binding of the dies can be strengthened.

In the present invention, the vertically die-stacked bonder includes:
 a self-elevating unit;
 a retrieval unit, neighbored to the self-elevating unit; and
 a receiving unit, neighbored to the retrieval unit;
 wherein at least one die is located at the self-elevating unit, the self-elevating unit elevates one of the at least one die by 90 degrees so as to have the die into a vertical state, the retrieval unit moves the die in the vertical state to the receiving unit, the self-elevating unit elevates again another one of the at least one die by 90 degrees so as to have this another one die into the vertical state, and the retrieval unit stacks laterally this another one die in the vertical state to the die already in the vertical state at the receiving unit.

In another aspect of the present invention, the vertically die-stacked method includes the steps of:
 (a) elevating a die by 90 degrees so as to have the die into a vertical state;
 (b) sucking the die in the vertical state by a retrieval unit, and moving the die to a receiving unit;
 (c) placing the die to the receiving unit by the retrieval unit;
 (d) elevating another die by 90 degrees so as to have the another die into the vertical state;
 (e) sucking the another die in the vertical state by the retrieval unit, and moving the another die to the receiving unit having the die; and
 (f) stacking laterally the another die in the vertical state to the die already at the receiving unit.

In one embodiment of the present invention, a first vision unit is included to capture image information of the receiving unit, and provides the image information to the retrieval unit and the receiving unit; wherein, in the step (c), the receiving unit bases on the image information from the first vision unit to adjust a position of the receiving unit with respect to the retrieval unit having the die; wherein, if the receiving unit is confirmed that the die can be placed to the receiving unit, the receiving unit moves laterally to place or adhere the die to the receiving unit; wherein the first vision unit is able to align the dies of the receiving unit and the retrieval unit simultaneously or individually.

In one embodiment of the present invention, a first vision unit is included to capture image information of the another die at the receiving unit, and provides the image information to the receiving unit and the retrieval unit; wherein, in the step (f), the receiving unit bases on the image information from the first vision unit to adjust a position of the die at the receiving unit with respect to the another die at the retrieval unit; wherein, if the another die at the retrieval unit is able to stack the another die to the die at the receiving unit, the receiving unit moves laterally so as to have the another die at the retrieval unit to stack laterally onto the die already at the receiving unit; wherein the first vision unit aligns the die at the receiving unit to the another die at the retrieval unit.

As stated above, the vertically die-stacked bonder and the method using the same of the present invention are to elevate the die by 90 degrees so as to set the die in the vertical state, and then to stack laterally the dies in the vertical state orderly, such that the stacking speed of the dies can be increased, the production cost can be reduced, and the productivity can be enhanced. Also, the number of die-stacked layers can be increased.

All these objects are achieved by the vertically die-stacked bonder and the method using the same described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a vertically die-stacked bonder and a method using the same. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
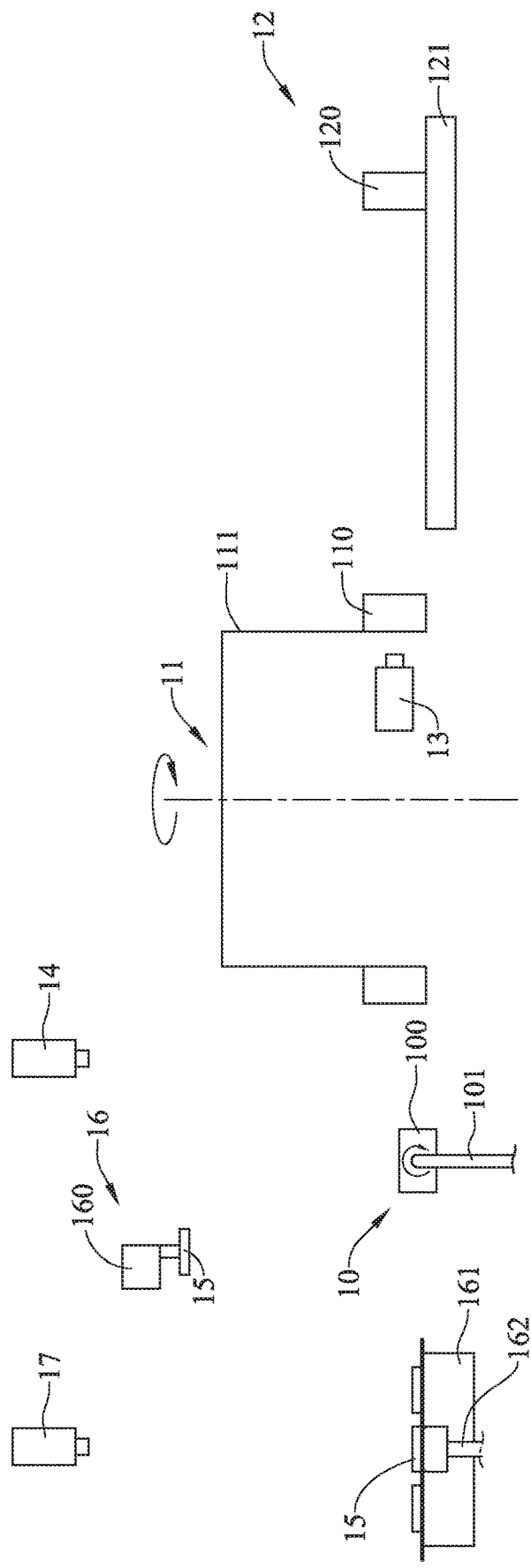
FIG. 1 is a schematic view of a first embodiment of the vertically die-stacked bonder in accordance with the present invention.

Referring now to FIG. 1, a schematic view of a first embodiment of the vertically die-stacked bonder in accordance with the present invention is shown. The vertically die-stacked bonder includes a self-elevating unit 10, a retrieval unit 11, a receiving unit 12, a first vision unit 13, a second vision unit 14, a supply unit 16 and a third vision unit 17.

The self-elevating unit 10 has a self-elevating carrier 100 and a self-elevating displacement module 101, in which the self-elevating displacement module 101 is coupled with the self-elevating carrier 100.

The retrieval unit 11 neighbored to the self-elevating unit 10 has at least two sucking modules 110 and a rotational retrieval module 111, in which the sucking modules 110 are individually mounted to the rotational retrieval module 111.

The receiving unit 12 neighbors to the retrieval unit 11 has a receiving carrier 120 and a receiving displacement module 121, in which the receiving carrier 120 is located on the receiving displacement module 121.

The first vision unit 13 is located under the retrieval unit 11 at a position respective to the receiving carrier 120.

The second vision unit 14 is located above the self-elevating unit 10.

The supply unit 16 neighbored to the self-elevating unit 10 has at least one supply-suck module 160, a carrier 161 and at least one ejection pin 162, in which the carrier 161 is to mount thereon at least one die 15, the ejection pin 162 is mounted inside the carrier 161 so as to eject the die 15 placed on the carrier 161, and the supply-suck module 160 is located above the carrier 161 so as to suck the die 15 on the carrier 161 and then displace the die 15 to the self-elevating unit 10.

The third vision unit 17 is located above the carrier 161.

Figure 3:
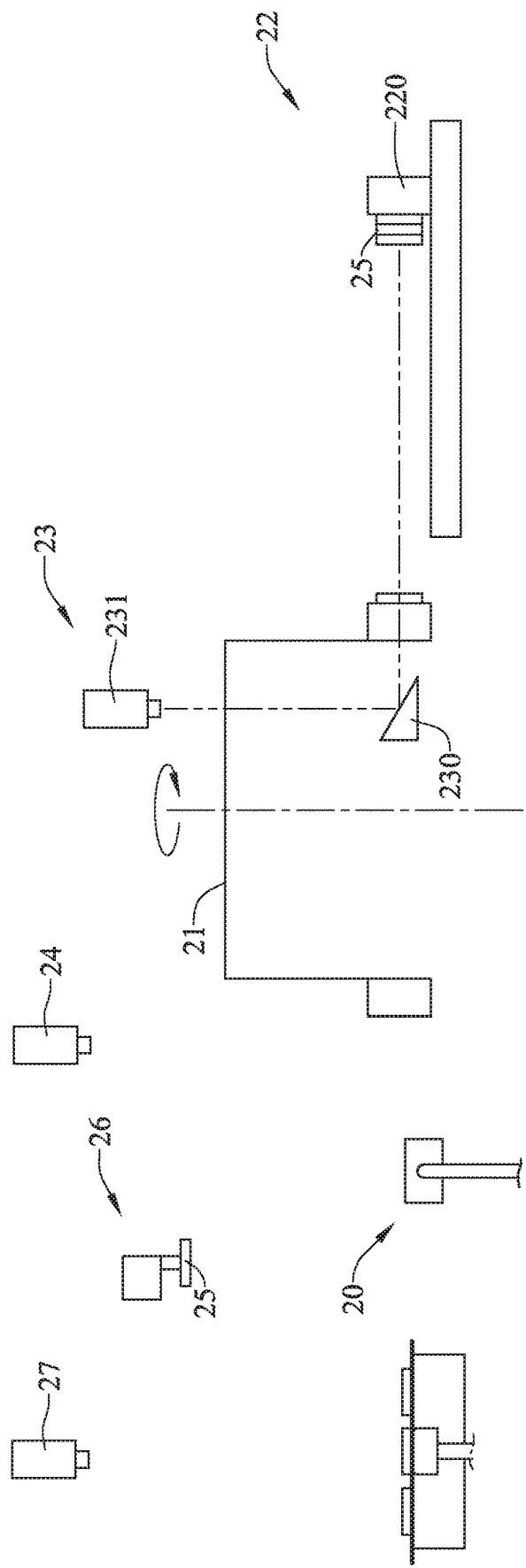
FIG. 3 is a schematic view of a second embodiment of the vertically die-stacked bonder in accordance with the present invention.

Referring now to FIG. 3, a schematic view of a second embodiment of the vertically die-stacked bonder in accordance with the present invention is shown. The vertically die-stacked bonder includes a self-elevating unit 20, a retrieval unit 21, a receiving unit 22, a first vision unit 23, a second vision unit 24, a supply unit 26 and a third vision unit 27.

In this second embodiment, the self-elevating unit 20, the retrieval unit 21, the receiving unit 22, the second vision unit 24, the supply unit 26 and the third vision unit 27 are the same to those in the first embodiment, and thus details thereabout are omitted herein.

The first vision unit 23 has a lens module 230 and an image-capturing module 231, in which the lens module 230 is located under the retrieval unit 21 at a position facing the receiving carrier 220, and the image-capturing module 231 is located above the retrieval unit 21 at a place opposing to the lens module 230 with respect to the retrieval unit 21.

Figure 4:
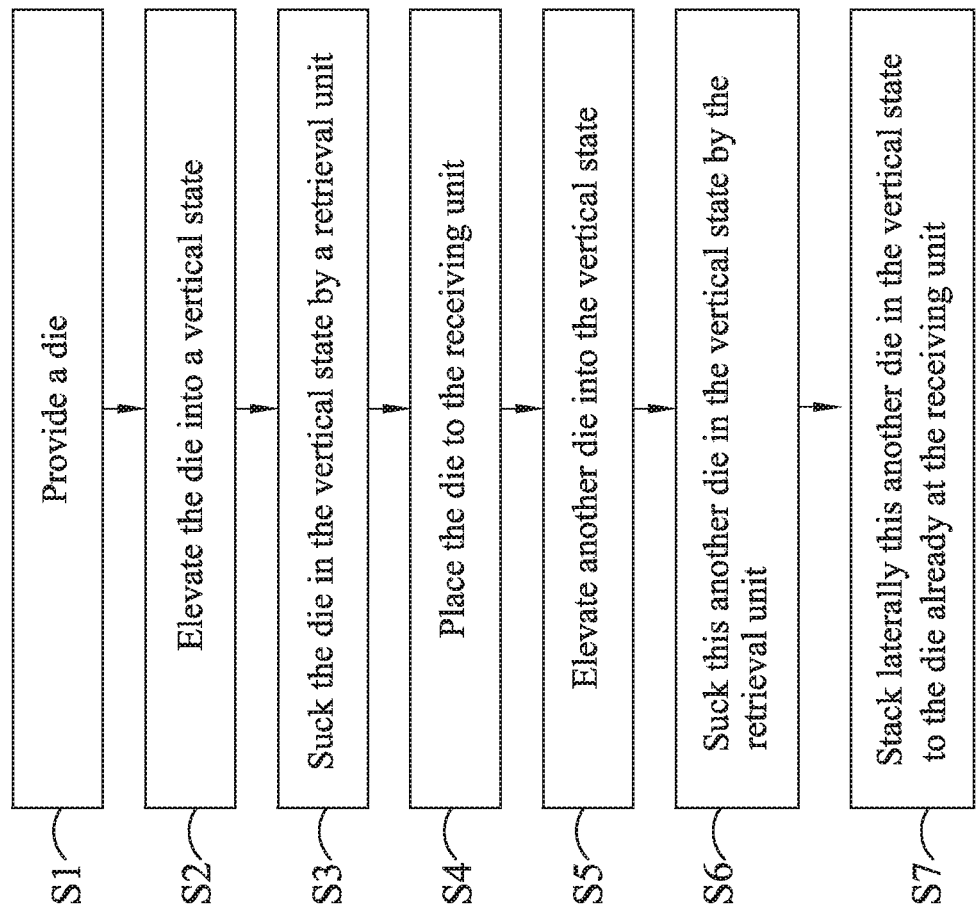
FIG. 4 is a flowchart of a preferred method using a vertically die-stacking binder in accordance with the present invention.

Referring now to FIG. 4, a flowchart of a preferred method using a vertically die-stacking binder in accordance with the present invention is shown. The method includes the following steps.

Step S1: Provide a die, as shown in FIG. 1. The third vision unit 17 captures image information of the die 15 on the carrier 161, and then the image information is further transmitted to the supply-suck module 160 and the ejection pin 162. According to the image information, the ejection pin 162 is to eject the specific die 15. Also, according to the image information, the supply-suck module 160 sucks the ejected die 15, and then the sucked die 15 is moved and placed on the self-elevating carrier 100 by the supply-suck module 160.

Figure 2:
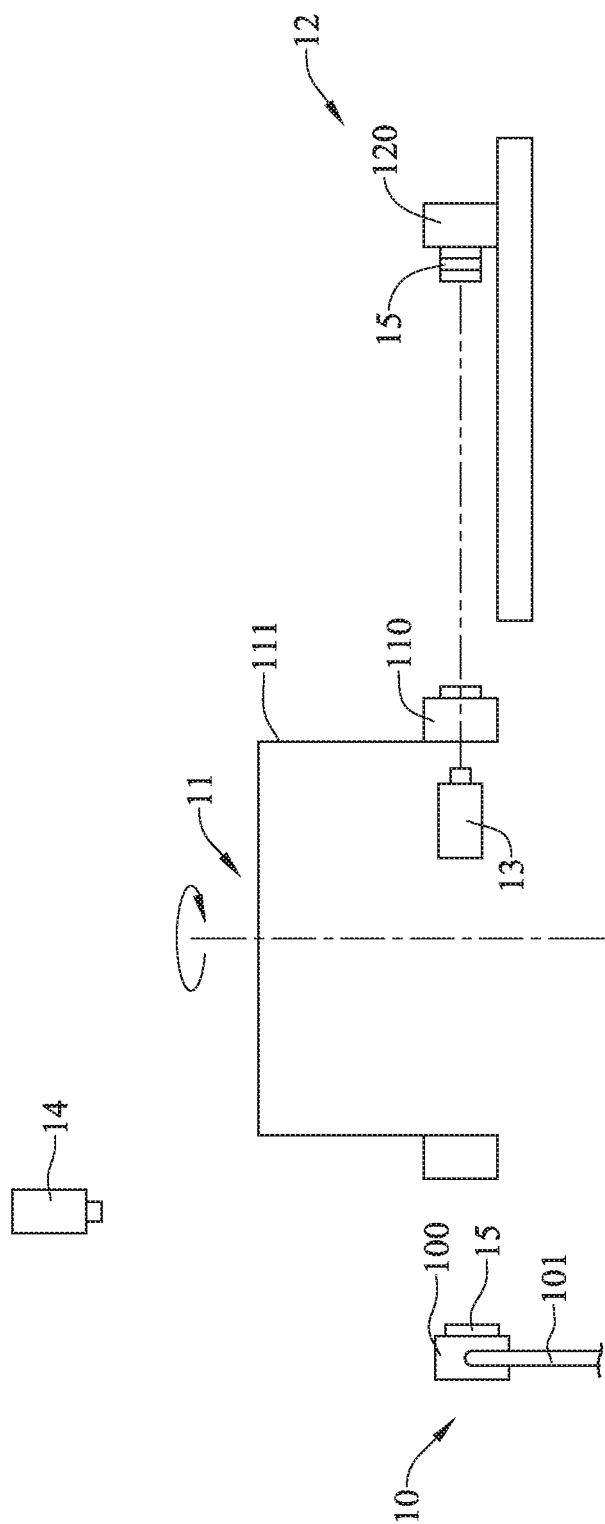
FIG. 2 is another schematic view of the first embodiment of the vertically die-stacked bonder in accordance with the present invention.

Step S2: Elevate the die into a vertical state. As shown in FIG. 2, the at least one die 15 is placed on the self-elevating carrier 100. The self-elevating displacement module 101 is to elevate the self-elevating carrier 100 by 90 degrees with respect to the self-elevating displacement module 101 and parallel to the sucking module 110. When the self-elevating carrier 100 is elevated by 90 degrees, the die 15 on the self-elevating carrier 100 is also elevated by 90 degrees into the vertical state.

Step S3: Suck the die in the vertical state by the retrieval unit. The second vision unit 14 captures image information of the dies 15 on the self-elevating carrier 100, and then the image information is transmitted to the self-elevating displacement module 101 for compensating the position, such that the retrieval unit 11 can accurately fetch, by sucking, the die 15 that has been compensated in positioning and elevated into the vertical state. Then, the rotational retrieval module 111 rotates the sucking module 110 (having the die 15 already) to a position of the receiving unit 12.

As shown in FIG. 2, the first vision unit 13 captures an image of the receiving carrier 120, and then provides the corresponding image information to the retrieval unit 11 and the receiving unit 12.

In addition, the first vision unit 13 can simultaneously or individually align the receiving carrier 120 and the die 15 at the retrieval unit 11.

Referring now to FIG. 3, in this embodiment, the image-capturing module 231 captures the image information in the lens module 230, in which the image information is the image information of the die 25 at the receiving carrier 220 or the retrieval unit 21.

Step S4: Place the die to the receiving unit. As shown in FIG. 2, the receiving unit 12 receives the image information from the first vision unit 13 so as to allow the receiving displacement module 121 to adjust the position of the receiving carrier 120 with respect to the sucking module 110 having the die 15. The receiving displacement module 121 is laterally moved so as to have the die 15 able to be placed or adhered to the receiving carrier 120.

As shown in FIG. 3, the retrieval unit 21 receives the image information from the image-capturing module 231 of the first vision unit 23, and then the receiving unit 22 moves laterally so as to have the die 25 of the retrieval unit 21 able to be placed or adhered to the receiving carrier 220.

Step S5: Elevate another die into the vertical state. The self-elevating carrier 100 elevates this another die 15 and turns this die 15 into the vertical state. Similar to Step S1, the supply unit 16 provides this die 15 to the self-elevating carrier 100 again. Also, similar to Step S2, the second vision unit 14 captures the image information of the another die 15, and then transmits the image information to the retrieval unit 11.

Step S6: Suck this another die in the vertical state by the retrieval unit. Similar to Step S3, the self-elevating unit 10 compensates the position with respect to the retrieval unit 11 so as to allow the retrieval unit 11 to fetch this another die 15 in the vertical state precisely. The retrieval unit 11 receives the image information from the second vision unit 14, and allows the sucking module 110 to fetch, by sucking, this another die 15 on the self-elevating carrier 100. The sucking module 110 having this another die 15 is then rotated by the rotational retrieval module 111 to match the position of the receiving unit 12.

As shown in FIG. 2, the first vision unit 13 captures the image information of the die 15 on the receiving carrier 120, and then provides the image information top the retrieval unit 11 and the receiving unit 12.

Further, the first vision unit 13 captures the image information from the receiving carrier 120 or the existing image information of the die 15, and then provides the image information top the retrieval unit 11 and the receiving unit 12.

In addition, the first vision unit 13 can align the die 15 of the receiving carrier 120 and the die 15 of the retrieval unit 11 simultaneously.

As shown in FIG. 3, the image-capturing module 231 is to capture the image information from the lens module 230, which is the image information of the die 25 on the receiving carrier 220.

Step S7: Stack laterally this another die in the vertical state to the die already at the receiving unit. As shown in FIG. 1, similar to Step S4, the receiving unit 12 receives the image information from the first vision unit 13. If the die 15 already at the receiving unit 12 is not aligned with the another die 15 at the retrieval unit 11, then the receiving unit 12 would adjust its own position till the another die 15 at the retrieval unit 11 can match laterally the die 15 at the receiving unit 12. The receiving displacement module 121 moves laterally so as to allow the another die 15 to be placed or adhered to the die 15 already at the receiving unit 12.

If the image information received by the receiving unit 12 from the first vision unit 13 matches the precise position for stacking the die 15 onto the receiving unit 12, then the receiving unit 12 would not need any position adjustment. The receiving displacement module 121 moves laterally so as to have the another die 15 to be placed or adhered to the die 15 already at the receiving unit 12.

If the number of the dies 15 stacked at the receiving carrier 120 has reached a predetermined amount, then the method is stopped.

If the number of the dies 15 stacked at the receiving carrier 120 has not yet reached the predetermined amount, then go back to perform Step S5.

In summary, the vertically die-stacked bonder and the method using the same of the present invention are to elevate the die by 90 degrees so as to set the die in the vertical state, and then to stack laterally the dies in the vertical state orderly, such that the stacking speed of the dies can be increased, the production cost can be reduced, and the productivity can be enhanced.

In addition, the self-elevating unit can adjust the position with respect to the retrieval unit, so that the self-elevating unit can be accurately aligned with the retrieval unit, and thus the die can be placed to the predetermined position at the retrieval unit.

While the present invention has been particularly shown and described with reference to a preferred embodiment, it will be understood by those skilled in the art that various changes in form and detail may be without departing from the spirit and scope of the present invention.

What is claimed is:

1. A vertically die-stacked method, comprising the steps of:
    (a) elevating a die by 90 degrees so as to have the die into a vertical state;
    (b) sucking the die in the vertical state by a retrieval unit, and moving the die to a receiving unit;
    (c) placing the die to the receiving unit by the retrieval unit;
    (d) elevating another die by 90 degrees so as to have the another die into the vertical state;
    (e) sucking the another die in the vertical state by the retrieval unit, and moving the another die to the receiving unit having the die; and
    (f) stacking laterally the another die in the vertical state to the die already at the receiving unit.

2. The vertically die-stacked method of claim 1, wherein, in the step (f), if a number of the dies stacked at the receiving unit has reached a predetermined amount, then the method is stopped; and, if the number of the dies stacked at the receiving unit has not yet reached the predetermined amount, then go back to perform the step (d).

3. The vertically die-stacked method of claim 1, wherein, in the step (a), the die is located at a self-elevating carrier of a self-elevating unit, the self-elevating carrier is to elevate 90 degrees so as to have the die elevated by 90 degrees.

4. The vertically die-stacked method of claim 1, wherein, in the step (b), a first vision unit captures image information of the receiving unit, and provides the image information to the retrieval unit and the receiving unit; wherein, in the step (c), the receiving unit bases on the image information from the first vision unit to adjust a position of the receiving unit with respect to the retrieval unit having the die; wherein, if the receiving unit is confirmed that the die can be placed to the receiving unit, the receiving unit moves laterally to place or adhere the die to the receiving unit; wherein the first vision unit aligns the dies on the receiving unit and on the retrieval unit simultaneously or individually.

5. The vertically die-stacked method of claim 1, wherein, in the step (e), a first vision unit captures image information of the another die at the receiving unit, and provides the image information to the receiving unit and the retrieval unit; wherein, in the step (f), the receiving unit bases on the image information from the first vision unit to adjust a position of the die at the receiving unit with respect to the another die at the retrieval unit; wherein, if the another die at the retrieval unit is able to stack the another die to the die at the receiving unit, the receiving unit moves laterally so as to have the another die at the retrieval unit to stack laterally onto the die already at the receiving unit; wherein the first vision unit aligns the dies on the receiving unit and on the retrieval unit.

6. The vertically die-stacked method of claim 1, wherein, in the step (e), a second vision unit captures image information of the another die at the self-elevating unit, and provides the image information to the self-elevating unit first position compensation, such that the retrieval unit sucks the another die been compensated in position and already been elevated.

7. The vertically die-stacked method of claim 3, further including a step of a supply unit providing the die to the self-elevating carrier.

8. The vertically die-stacked method of claim 7, wherein the supply unit has a carrier, at least one ejection pin and at least one supply-suck module, the ejection pin being located in the carrier, the carrier mounting at least one die, a third vision unit capturing the image information of the die at the carrier so as to provide the image information to the ejection pin and the supply-suck module, the ejection pin basing on the image information to eject a specific die, the supply-suck module basing on the image information to suck the specific die and place the die to the self-elevating unit via the carrier.

* * * * *